(12) United States Patent
Suzuki et al.

(10) Patent No.: US 8,183,590 B2
(45) Date of Patent: May 22, 2012

(54) IMAGE DISPLAY APPARATUS HAVING RAISED PARTS DISPOSED ON A SUBSTRATE

(75) Inventors: Takahito Suzuki, Tokyo (JP); Tomoki Igari, Tokyo (JP)

(73) Assignee: Oki Data Corporation, Tokyo (JP)

( * ) Notice: Subject to any disclaimer, the term of this patent is extended or adjusted under 35 U.S.C. 154(b) by 89 days.

(21) Appl. No.: 12/656,297

(22) Filed: Jan. 25, 2010

(65) Prior Publication Data
US 2010/0187547 A1    Jul. 29, 2010

(30) Foreign Application Priority Data
Jan. 26, 2009  (JP) ................................ 2009-013816

(51) Int. Cl.
*H01L 33/00* (2010.01)
(52) U.S. Cl. ...................... 257/99; 257/88; 257/E25.02
(58) Field of Classification Search .................... 257/88, 257/99, E25.02
See application file for complete search history.

(56) References Cited

U.S. PATENT DOCUMENTS

| 5,907,151 A * | 5/1999 | Gramann et al. ......... 250/214.1 |
| 6,475,819 B2 * | 11/2002 | Franz ............................. 438/34 |
| 6,650,045 B1 * | 11/2003 | Forrest et al. ................ 313/504 |
| 2003/0178627 A1 * | 9/2003 | Marchl et al. .................. 257/80 |
| 2006/0197102 A1 * | 9/2006 | Ogihara et al. ................ 257/99 |
| 2006/0278885 A1 * | 12/2006 | Tain et al. ...................... 257/99 |
| 2008/0087902 A1 * | 4/2008 | Lee et al. ....................... 257/88 |
| 2009/0023234 A1 * | 1/2009 | Hsu et al. ....................... 438/27 |

FOREIGN PATENT DOCUMENTS

JP    2002-062825 A    2/2002

* cited by examiner

*Primary Examiner* — Howard Weiss
*Assistant Examiner* — John C Ingham
(74) *Attorney, Agent, or Firm* — Rabin & Berdo, PC (57) ABSTRACT

An image display apparatus displaying an image by selectively emitting light from a plurality of semiconductor light emitting elements being regularly arranged, includes a substrate; a first conductive wiring layer being formed on the substrate and supplying a first electric potential; a second conductive wiring layer supplying a second electric potential; the plurality of semiconductor light emitting elements each including a first electrode layer being electrically connected to the first conductive wiring layer and a second electrode layer being electrically connected to the second conductive wiring layer; and a plurality of raised parts being disposed on the substrate, each of the raised parts having an upper surface which is higher than an upper surface of the first conductive wiring layer; wherein the plurality of semiconductor light emitting elements is fixed on the plurality of raised parts respectively.

19 Claims, 10 Drawing Sheets

IMAGE DISPLAY APPARATUS HAVING RAISED PARTS DISPOSED ON A SUBSTRATE

BACKGROUND OF THE INVENTION

1. Field of the Invention

The present invention relates to an image display apparatus for displaying an image by selectively emitting light from a plurality of regularly arranged semiconductor light emitting elements.

2. Description of the Related Art

A large-sized image display apparatus (LED display) which includes a plurality of semiconductor light emitting elements (LEDs) arranged two-dimensionally is practically used. In general, the LEDs in the LED display are bullet-shaped LED modules, each of which has an LED chip sealed with a resin or the like. However, since the bullet-shaped LED modules are large in size and each module has a diameter of about 3 mm, it is required that the modules are soldered to a mount substrate one by one and an arrangement pitch (pixel pitch) of the bullet-shaped LED modules is at least about 10 mm. For this reason, no bullet-shaped LED modules are available for a small-sized LED display.

For example, Japanese Patent Application Kokai Publication No. 2002-62825 as Patent Document 1 proposes an LED display with a smaller pixel pitch in order to realize downsizing and high definition. In this document, LED elements are arranged on a mount substrate, by forming the LED elements as display elements on a wafer, and repeating steps of separating the LED elements into pieces and then transferring the separated LED elements on the mount substrate.

However, since a mount substrate on which LED elements are to be formed on a wafer are mounted has matrix wiring composed of anode conductive wiring layers and cathode conductive wiring layers and a pixel pitch is very small, a permissible margin of a mount position of each LED element in an LED display is extremely small. For this reason, even if the mount position of the LED element is slightly shifted, there is a probability that a short circuit between the conductive wiring layers occurs because of the shifted LED element.

In a case to use fluid die-bonding paste for fixing LED elements on a mount substrate, even if a mount position of an LED element is not shifted, there is a probability that a short circuit between the conductive wiring layers occurs because of the die-bonding paste pressed out from between the LED element and the mount substrate.

SUMMARY OF THE INVENTION

An object of the present invention is to provide an image display apparatus which can prevent a short circuit between conductive wiring layers from occurring because of a semiconductor light emitting element mounted on a substrate on which the conductive wiring layers are formed.

According to one aspect of the present invention, an image display apparatus displaying an image by selectively emitting light from a plurality of semiconductor light emitting elements being regularly arranged, includes a substrate; a first conductive wiring layer being formed on the substrate and supplying a first electric potential; a second conductive wiring layer supplying a second electric potential; the plurality of semiconductor light emitting elements each including a first electrode layer being electrically connected to the first conductive wiring layer and a second electrode layer being electrically connected to the second conductive wiring layer; and a plurality of raised parts being disposed on the substrate, each of the raised parts having an upper surface which is higher than an upper surface of the first conductive wiring layer; wherein the plurality of semiconductor light emitting elements is fixed on the plurality of raised parts respectively.

According to another aspect of the present invention, an image display apparatus displaying an image by selectively emitting light from a plurality of semiconductor light emitting elements being regularly arranged, includes a substrate; a first conductive wiring layer supplying a first electric potential; a second conductive wiring layer being formed on the substrate and supplying a second electric potential; the plurality of semiconductor light emitting elements each including a first electrode layer being electrically connected to the first conductive wiring layer and a second electrode layer being electrically connected to the second conductive wiring layer; and a raised part being disposed on the substrate, the raised part having an upper surface which is higher than an upper surface of the second conductive wiring layer; wherein a part of the first conductive wiring layer is disposed on the raised part, and the plurality of semiconductor light emitting elements is fixed to the plurality of second conductive wiring layers formed on the substrate respectively.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

First Embodiment

Figure 1:
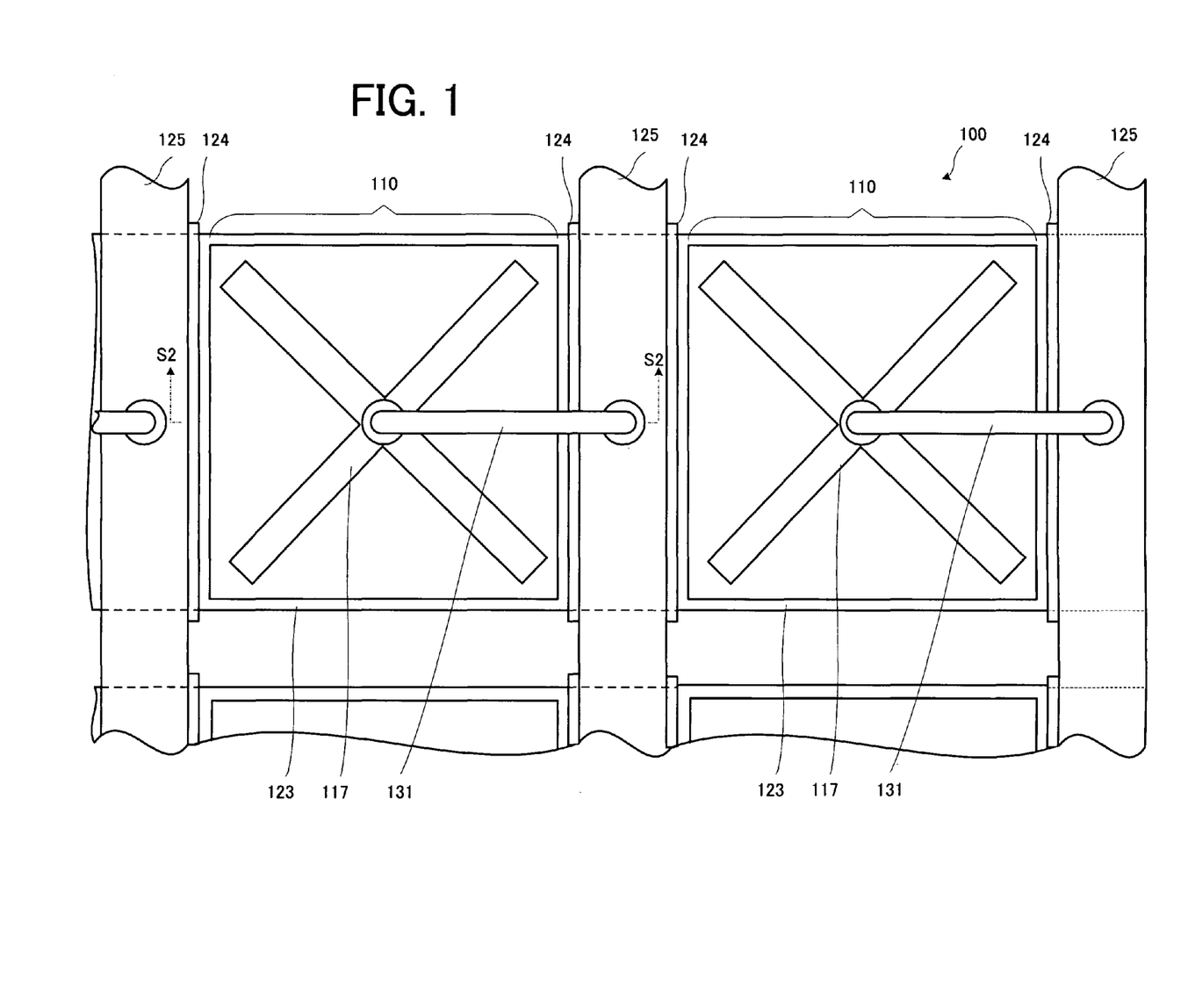
FIG. 1 is a plan view schematically showing a principal part of an image display apparatus according to a first embodiment of the present invention.
Figure 2:
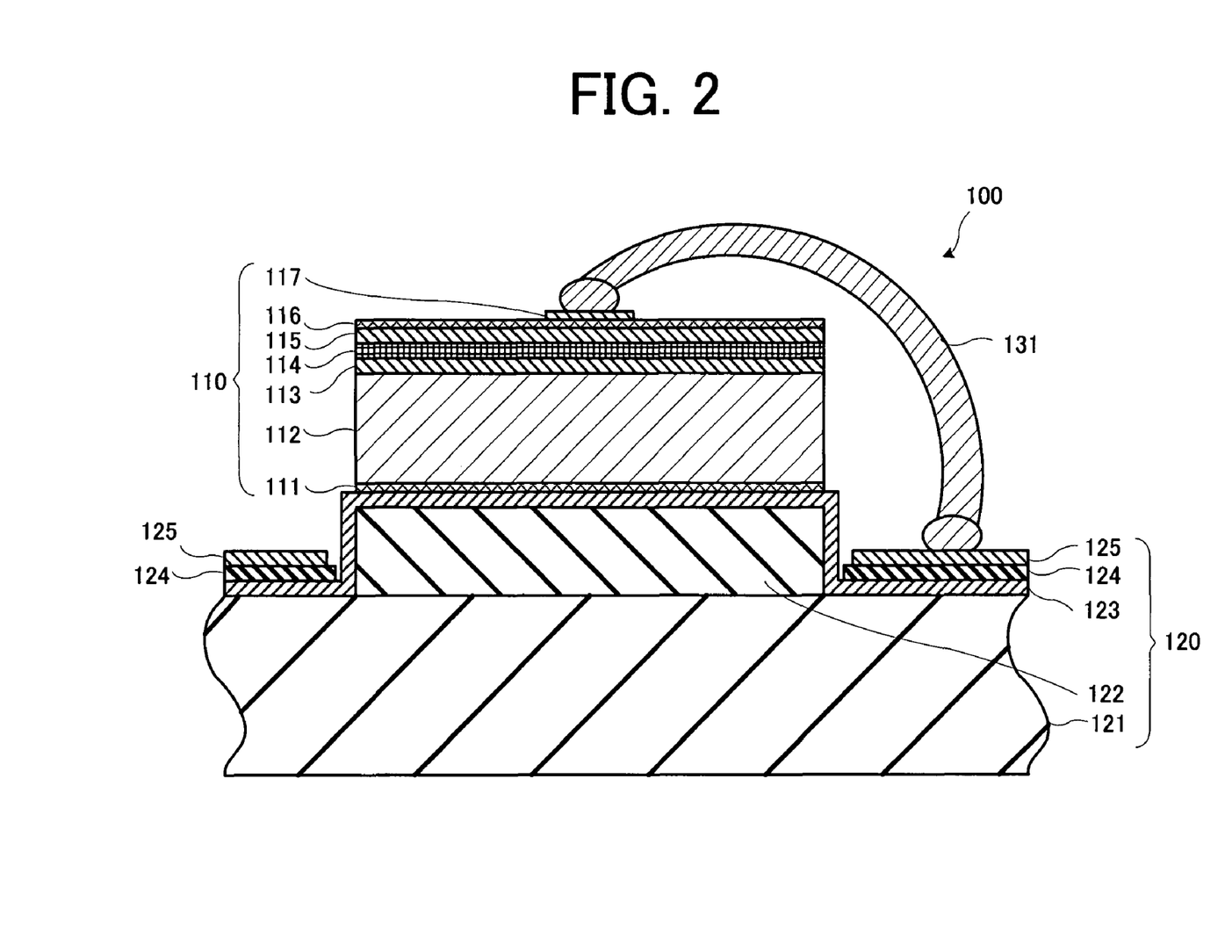
FIG. 2 is a schematic sectional view taken along a line S2-S2 of FIG. 1.

FIG. 1 is a plan view schematically showing a principal part of an image display apparatus 100 according to the first embodiment, and FIG. 2 is a schematic sectional view taken along a line S2-S2 of FIG. 1. FIG. 1 and FIG. 2 show only a part of the image display apparatus 100. The image display apparatus 100 is an LED display for displaying an image by selectively emitting light from a plurality of semiconductor light emitting elements (LEDs or LED chips) 110 as pixels, which are regularly arranged, for example, in the form of two-dimensional matrix arrangement. As shown in FIG. 1 or FIG. 2, the image display apparatus 100 is formed by adhering a plurality of LED chips 110 manufactured in advance to a substrate-side structure 120 and then bonding a plurality of bonding wires 131. An arrangement pitch of the pixels can be a value within a range of 100 μm to 1 mm, for example.

As shown in FIG. 2, the substrate-side structure 120 includes a substrate 121, a raised part (or projecting structure) 122 being disposed on the substrate 121, a plurality of cathode conductive wiring layers 123 being formed on the substrate 121 and the raised part 122 and supplying a cathode potential as a second electric potential, an interlayer insulating film 124 being formed on the cathode conductive wiring layer 123, and a plurality of anode conductive wiring layers 125 being formed on the interlayer insulating film 124 and supplying an anode potential as a first electric potential. The plurality of cathode conductive wiring layers 123 and the plurality of anode conductive wiring layers 125 extend in orthogonal directions to each other and form matrix-shaped conductive wiring layers, for example. The anode conductive wiring layer 125 is formed on an area which is not heightened by the raised part 122 and is insulated from the cathode conductive wiring layer 123 by providing the interlayer insulating film 124 therebetween. Each of the conductive wiring layers 123 and 125 can be 1 μm or less in thickness, for example.

As shown in FIG. 2, the raised part 122 is formed to be higher than the anode conductive wiring layers 125. The raised part 122 is a structural part integrally formed with the substrate 121, or a structural member fixed to the substrate 121. The raised part 122 can be integrally formed with the substrate 121, for example, by using cutting processing or etching processing to substrate material for forming the substrate 121. Furthermore, the raised part 122 can be pattern-formed by an organic insulating film such as polyimide, epoxy or acrylic, or, by an inorganic insulating film such as SiN, $SiO_2$ or $Al_2O_3$, for example. As to the height of the raised part 122, any value which exceeds that of the anode conductive wiring layer 125 is available. In other words, each of the raised parts 122 has an upper surface which is higher than an upper surface of the anode conductive wiring layer 125, and the plurality of semiconductor light emitting elements 110 is fixed on the plurality of raised parts 122 respectively. It is preferable that the height of the raised part 122 be 2 μm or more, for example.

As shown in FIG. 2, the LED chip 110 includes a laminated structure of a cathode electrode pad 111, an N-type contact layer 112, an N-type clad layer 113, an active layer 114, a P-type clad layer 115, a P-type contact layer 116, and an anode electrode pad 117. The manufacturing process of the LED chip 110 can be selected from publicly-known manufacturing processes, for example. The LED chip 110 is mounted on the cathode conductive wiring layer 123 formed on the raised part 122 on the substrate 121, for example, by using die-bonding paste or an adhesive agent, or, by eutectic bonding or intermolecular force bonding. The raised part 122 makes a level of a bonding surface of the LED chip 110 (i.e., an upper surface of the anode electrode pad 117) higher than a level of a bonding surface of the anode conductive wiring layer 125 (i.e., an upper surface of the anode conductive wiring layer 125). The LED chip 110 may also be a semiconductor thin film light emitting element, which is described in the third embodiment, for example. The anode electrode pad 117 is connected to the anode conductive wiring layer 125 by the Au bonding wire 131, for example. If the LED chip 110 is not formed by the semiconductor light emitting thin film, the LED chip 110 can be 300 μm or less in thickness, for example.

Figure 3:
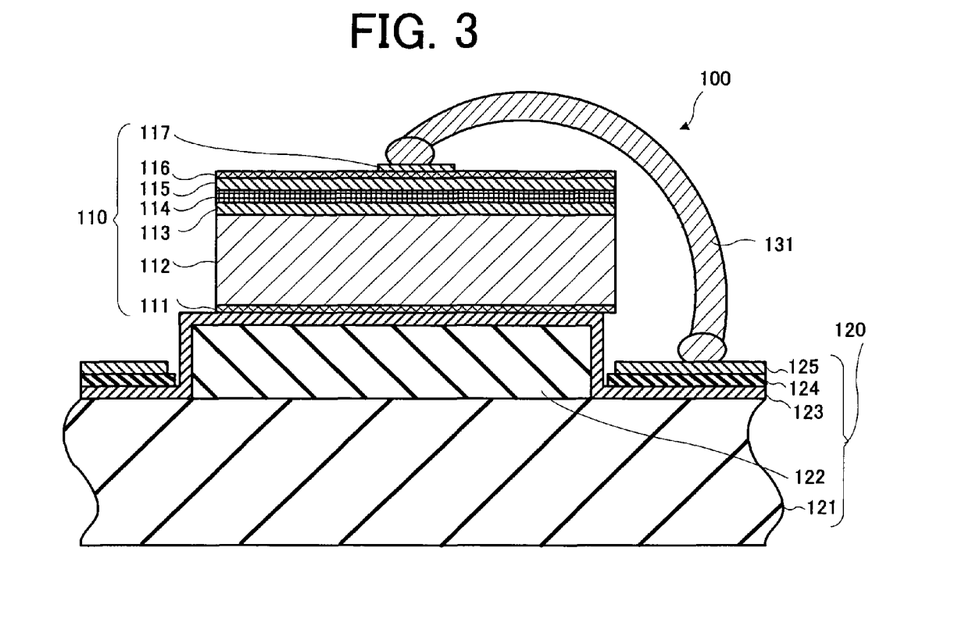
FIG. 3 is an explanatory diagram illustrating an advantageous effect of the image display apparatus according to the first embodiment.
Figure 4:
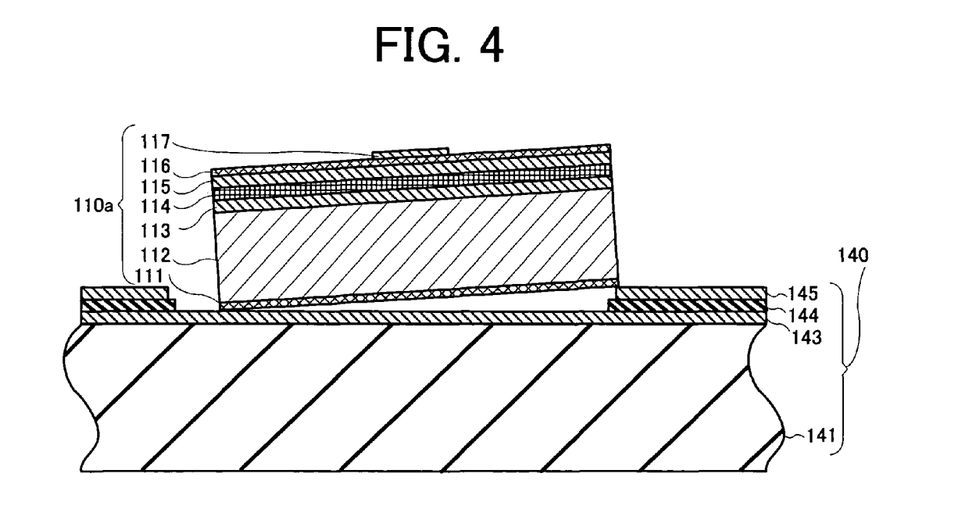
FIG. 4 is a sectional view of a comparative example.

FIG. 3 is an explanatory diagram illustrating an advantageous effect of the image display apparatus 100 according to the first embodiment, and FIG. 4 is a sectional view showing a case of a comparative example. As shown in FIG. 3, in a high precision mounting process of the LED chip 110 on the substrate-side structure 120, there is a probability that an arrangement position of the LED chip 110 is slightly shifted. In the image display apparatus 100 according to the first embodiment having the raised part 122, even if the arrangement position of the LED chip 110 is shifted, no short circuit between the conductive wiring layers occurs because of the shifted LED chip 110, as shown in FIG. 3. On the contrary, as shown in FIG. 4, in a case without the raised part (122 in FIG. 3), if an arrangement position of the LED chip 110a is slightly shifted, a short circuit between the conductive wiring layers is apt to occur. Thus, the image display apparatus 100 according to the first embodiment can prevent a short circuit between the conductive wiring layers from occurring because of the shift in an arrangement position of the LED chip 110.

Figure 5:
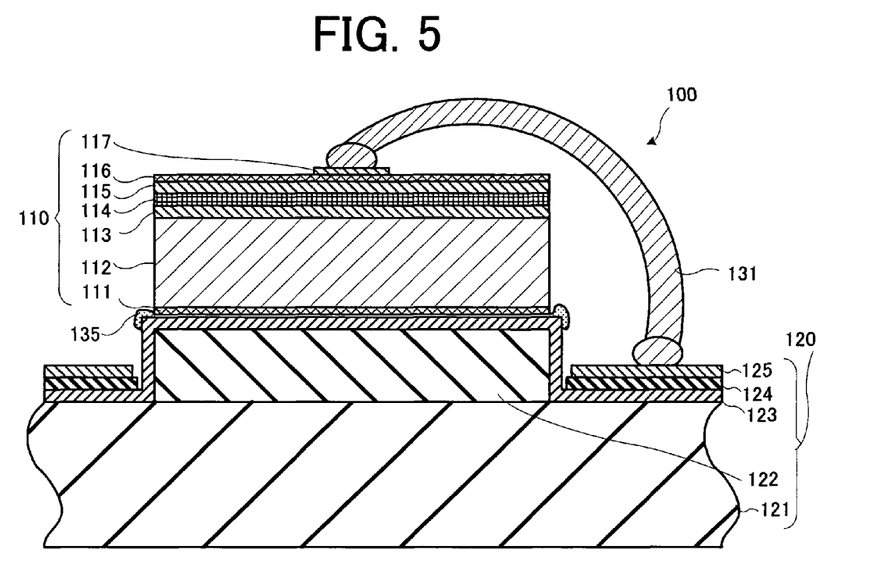
FIG. 5 is an explanatory diagram illustrating another advantageous effect of the image display apparatus according to the first embodiment.
Figure 6:
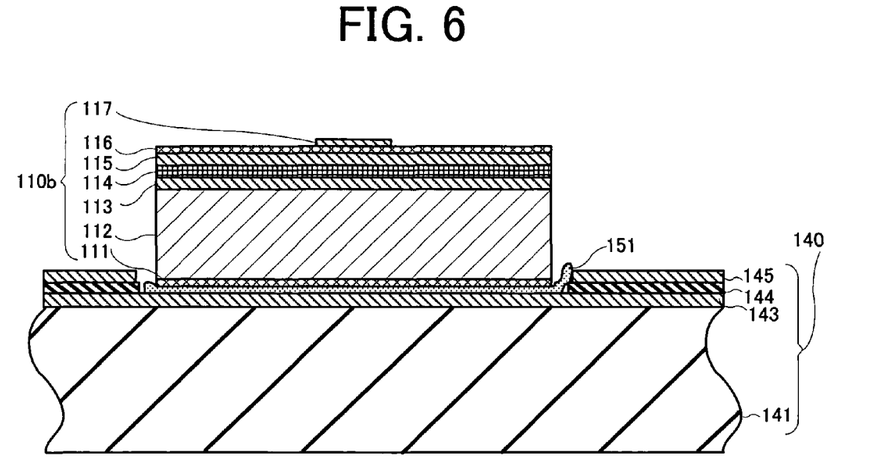
FIG. 6 is a sectional view of another comparative example.

FIG. 5 is an explanatory diagram illustrating another advantageous effect of the image display apparatus 100 according to the first embodiment, and FIG. 6 is a sectional view showing a case of the comparative example. As shown in FIG. 5, in a case that the LED chip 110 is adhered to the substrate-side structure 120 with fluid conductive paste such as die-bonding paste, there is a probability that the die-bonding paste 135 is forced out (or overflowed) on the raised part 122. In the image display apparatus 100 according to the first embodiment having the raised part 122, even if the die-bonding paste 135 is forced out from under the LED chip 110 to the outside at an arrangement position of the LED chip 110 on the raised part 122, no short circuit between the conductive wiring layers occurs because the overflowed die-bonding paste 135 is not in contact with the conductive wiring layers, as shown in FIG. 5. On the contrary, as shown in FIG. 6, in a case without the raised part (122 in FIG. 5), even if an arrangement position of the LED chip 110 is not shifted, there is a probability that die-bonding paste 151 is forced out (or overflowed) from under the LED chip 110 to the outside and a short circuit between the conductive wiring layers accordingly occurs. Thus, the image display apparatus 100 according to the first embodiment can prevent a possible short circuit between the conductive wiring layers from occurring because of the die-bonding paste forced out from under the LED chip 110 to the outside.

As described above, the image display apparatus 100 according to the first embodiment can extremely reduce occurrence frequency of a short circuit between the conductive wiring layers because of the shifted LED chip 110 mounted on the substrate-side structure 120 on which the anode conductive wiring layer 125 and the cathode conductive wiring layer 123 are formed or because of the overflowed die-bonding paste, and thereby the highly-reliable image display apparatus 100 with a low failure rate can be provided.

Furthermore, the present invention can be applied to a case that the structure of the explanation described above includes the anode conductive wiring layers 125 and the cathode conductive wiring layers 123 which are inversely disposed and the LED chip has an inversely-ordered laminated structure.

Second Embodiment

Figure 7:
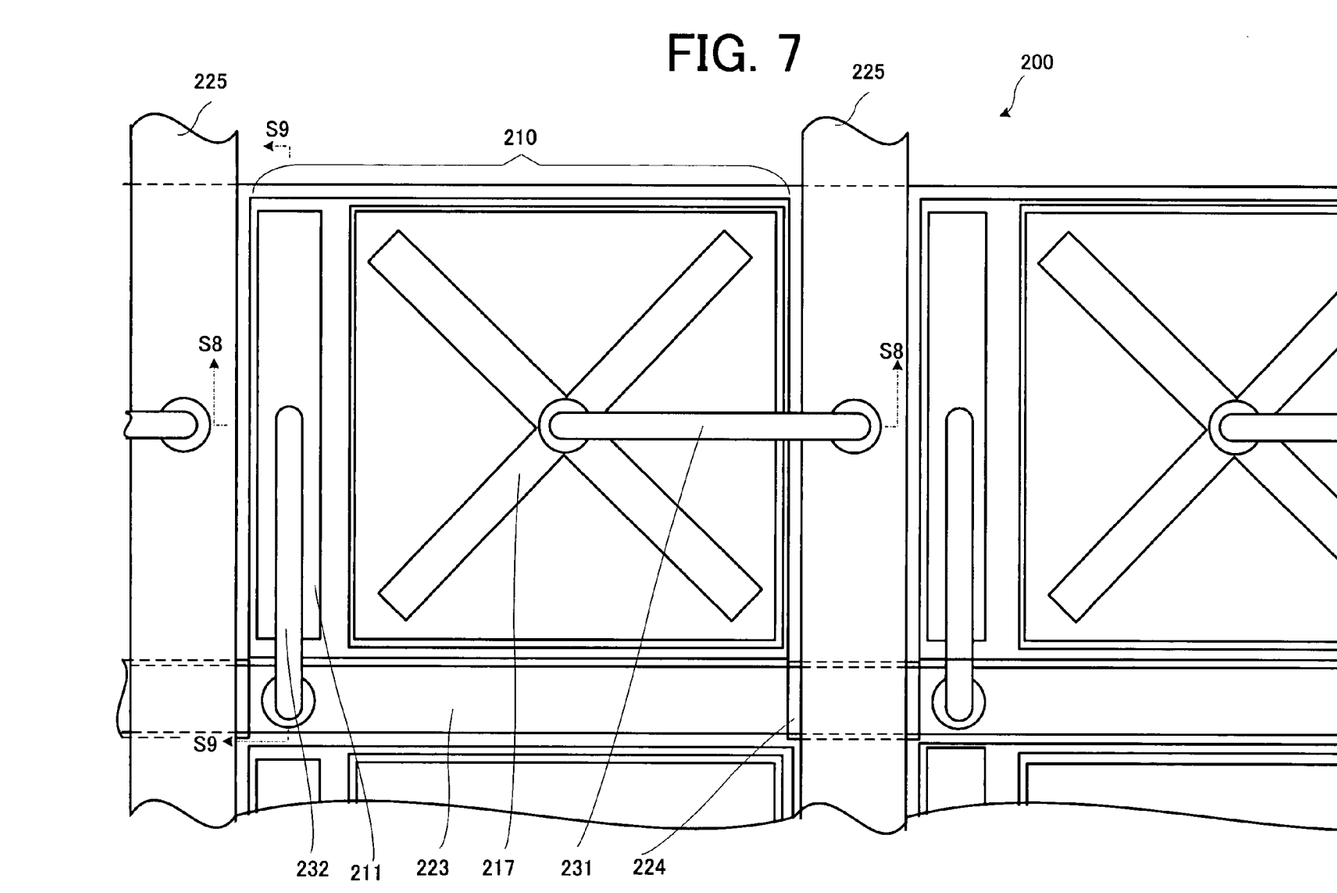
FIG. 7 is a plan view schematically showing a principal part of an image display apparatus according to a second embodiment of the present invention.
Figure 8:
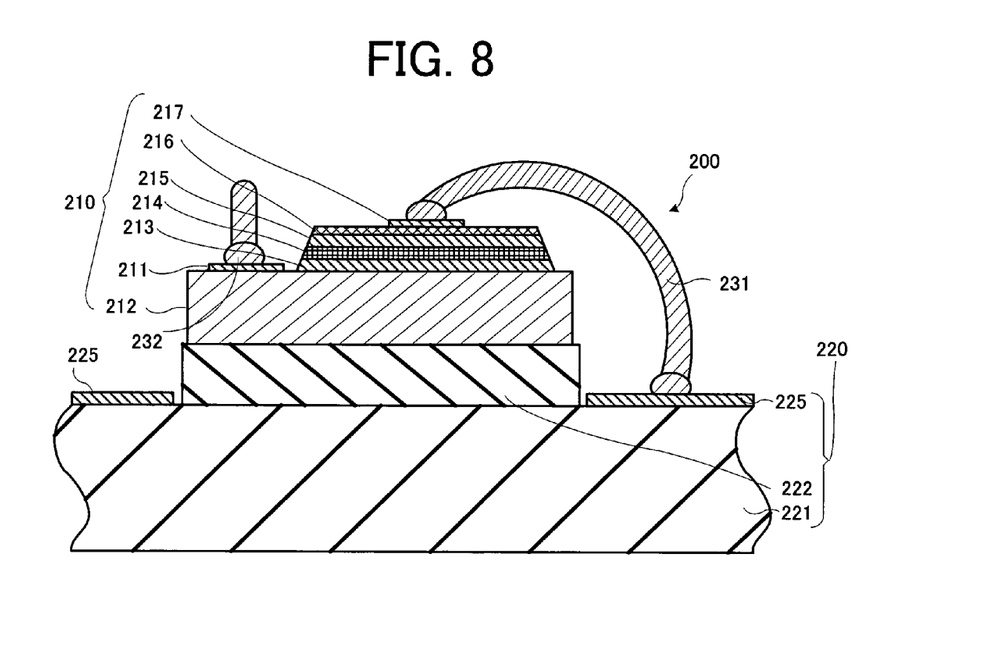
FIG. 8 is a schematic sectional view taken along a line S8-S8 of FIG. 7.
Figure 9:
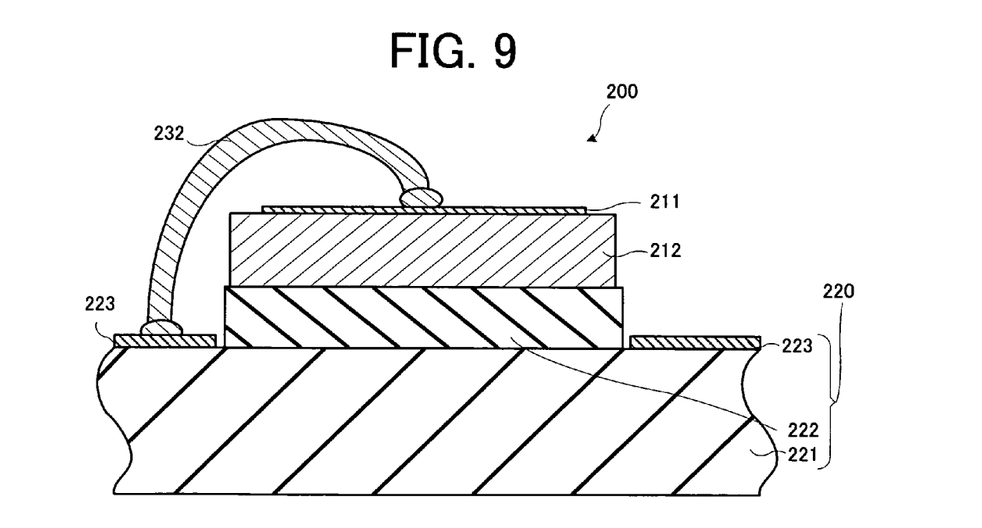
FIG. 9 is a schematic sectional view taken along a line S9-S9 of FIG. 7.

FIG. 7 is a plan view schematically showing a principal part of an image display apparatus 200 according to the second embodiment of the present invention, FIG. 8 is a schematic sectional view taken along a line S8-S8 of FIG. 7, and FIG. 9 is a schematic sectional view taken along a line S9-S9 of FIG. 7. FIG. 7 to FIG. 9 show only a part of the image display apparatus 200. The image display apparatus 200 is an LED display for displaying an image by selectively emitting light from a plurality of semiconductor light emitting elements (LEDs or LED chips) 210 as pixels, which are regularly arranged, for example, in the form of two-dimensional matrix arrangement. As shown in FIG. 7 to FIG. 9, the image display apparatus 200 is formed by adhering a plurality of LED chips 210 manufactured in advance to a substrate-side structure 220 and then bonding a plurality of bonding wires 231 and a plurality of bonding wires 232.

As shown in FIG. 7, FIG. 8, or FIG. 9, the substrate-side structure 220 includes a substrate 221, a raised part (or projecting structure) 222 being disposed on the substrate 221, a plurality of cathode conductive wiring layers 223 being formed on the substrate 221 and supplying a cathode potential as a second electric potential, an interlayer insulating film 224 (shown in only FIG. 6) being formed on the cathode conductive wiring layer 223, and a plurality of anode conductive wiring layers 225 being formed on the substrate 221 and the interlayer insulating film 224 and supplying an anode potential as a first electric potential. The plurality of cathode conductive wiring layers 223 and the plurality of anode conductive wiring layers 225 extend in orthogonal directions to each other and form matrix-shaped wiring layers, for example. The anode conductive wiring layer 225 is insulated from the cathode conductive wiring layer 223 by providing the interlayer insulating film 224 therebetween. Each of the conductive wiring layers can be 1 µm or less in thickness, for example.

As shown in FIG. 7 or FIG. 8, the raised part 222 is formed to be higher than both of the anode conductive wiring layer 225 and the cathode conductive wiring layer 223. In other words, the raised part 222 has an upper surface which is higher than upper surfaces of the anode conductive wiring layer 225 and the cathode conductive wiring layer 223. The raised part 222 has the same structure as the raised part 122 in the first embodiment.

As shown in FIG. 7 or FIG. 8, the LED chip 210 includes a laminated structure of an N-type contact layer 212, an N-type clad layer 213, an active layer 214, a P-type clad layer 215, a P-type contact layer 216 and an anode electrode pad 217, and further includes a cathode electrode pad 211 on the N-type contact layer 212. The LED chip 210 is mounted on the raised part 222 in the same manner as the LED chip 110 in the first embodiment. The raised part 222 makes levels of bonding surfaces of the LED chip 210 (i.e., an upper surface of the anode electrode pad 217 and an upper surface of the cathode electrode pad 211) higher than levels of bonding surfaces of the anode conductive wiring layer 225 (i.e., an upper surface of the anode conductive wiring layer 225) and the cathode conductive wiring layer 223 (i.e., an upper surface of the cathode conductive wiring layer 223). The LED chip 210 may be a semiconductor thin film light emitting element, which is described in the third embodiment, for example. The anode electrode pad 217 is connected to the anode conductive wiring layer 225 by the Au bonding wire 231, for example, and the cathode electrode pad 211 is connected to the cathode conductive wiring layer 223 by the Au bonding wire 232, for example. The structure of the LED chip 210 is an effective structure to adopt an LED which uses a nitride semiconductor on which a rear surface electrode is difficult to form.

In the image display apparatus 200 according to the second embodiment, even if an arrangement position of the LED chip 210 is slightly shifted in a high precision mounting process of the LED chip 210 on the substrate-side structure 220, no short circuit between the conductive wiring layers occurs because of the shifted LED chip 210.

Furthermore, in the image display apparatus 200 according to the second embodiment, in a case that the LED chip 210 is adhered to the substrate-side structure 220 with fluid conductive paste such as die-bonding paste, even if the die-bonding paste is forced out (or overflowed) from under the LED chip 210 at an arrangement position of the LED chip 210 on the raised part 222, no short circuit between the conductive wiring layers occurs because of the overflowed die-bonding paste.

As described above, the image display apparatus 200 according to the second embodiment can extremely reduce occurrence frequency of a short circuit between the conductive wiring layers because of the shifted LED chip 210 mounted on the substrate-side structure 220, on which the anode conductive wiring layer 225 and the cathode conductive wiring layer 223 are formed or because of the overflowed die-bonding paste, and thereby the highly-reliable image display apparatus 200 with a low failure rate can be provided.

Except for the points described above, the second embodiment is the same as the first embodiment.

Third Embodiment

Figure 10:
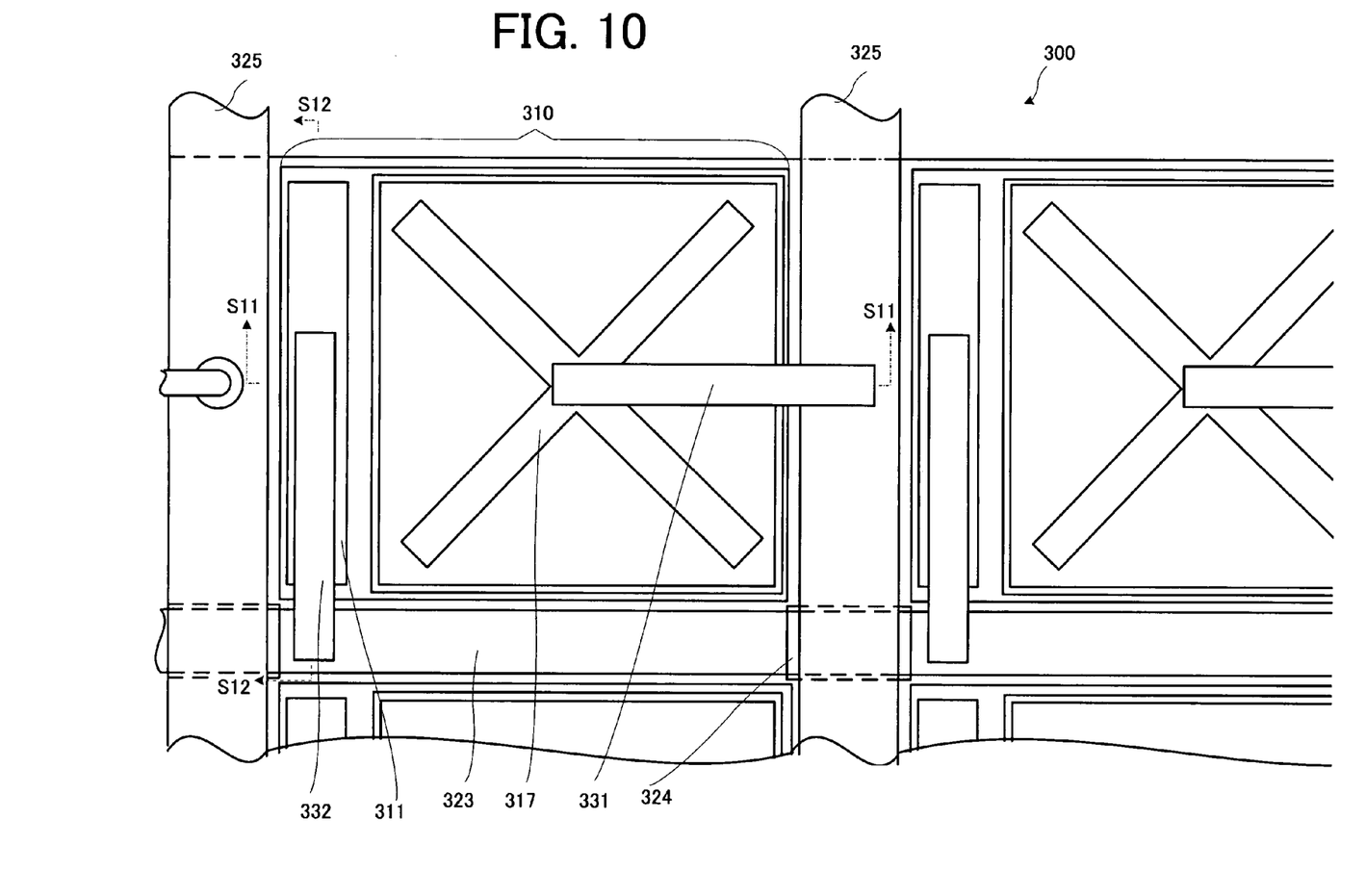
FIG. 10 is a plan view schematically showing a principal part of an image display apparatus according to a third embodiment of the present invention.
Figure 11:
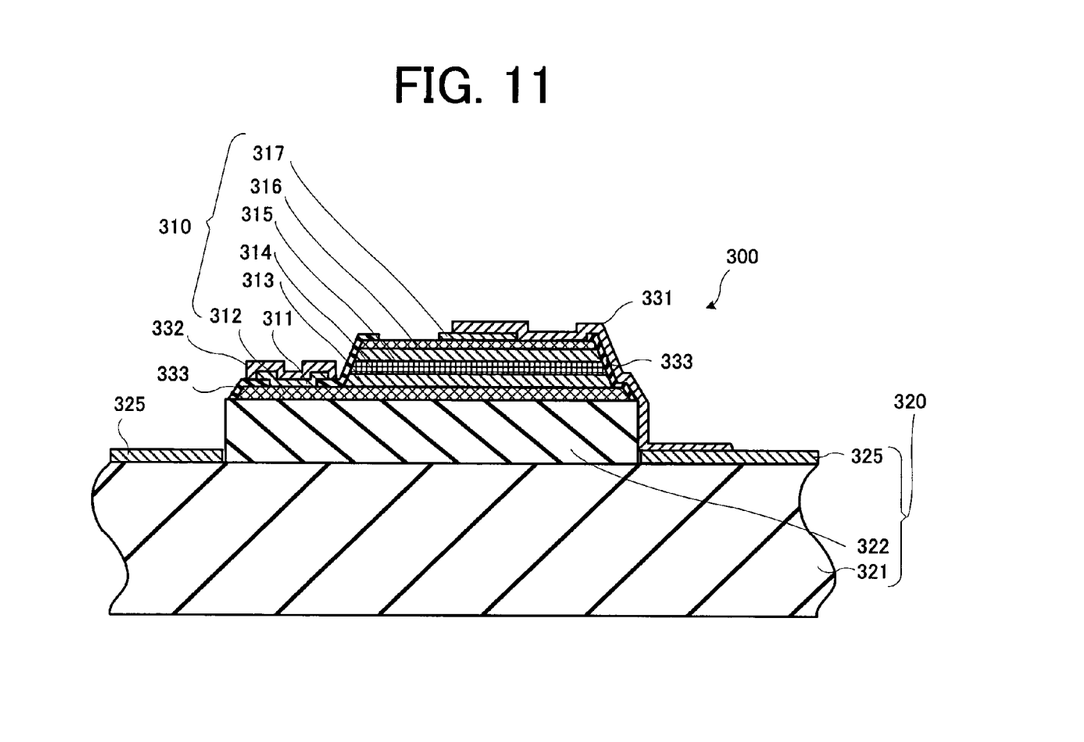
FIG. 11 is a schematic sectional view taken along a line S11-S11 of FIG. 10.
Figure 12:
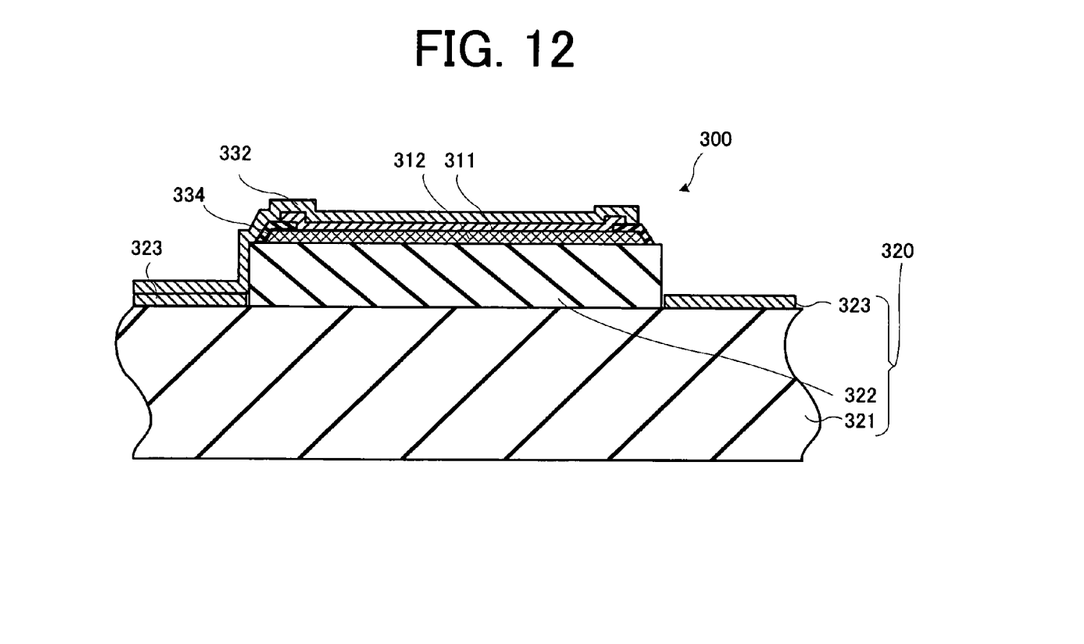
FIG. 12 is a schematic sectional view taken along a line S12-S12 of FIG. 10.

FIG. 10 is a plan view schematically showing a principal part of an image display apparatus 300 according to the third embodiment, FIG. 11 is a schematic sectional view taken along a line S11-S11 of FIG. 10, and FIG. 12 is a schematic sectional view taken along a line S12-S12 of FIG. 10. FIG. 10 to FIG. 12 show only a part of the image display apparatus 300. The image display apparatus 300 is an LED display for displaying an image by selectively emitting light from a plurality of semiconductor light emitting elements (LEDs or LED chips) 310 as pixels, which are regularly arranged, for example, in the form of two-dimensional matrix arrangement. As shown in FIG. 10 to FIG. 12, the image display apparatus 300 is formed by adhering (or bonding) a plurality of LED chips 310 manufactured in advance to a substrate-side structure 320, then forming an anode thin-film wiring layer 331 with sandwiching an interlayer insulating film 333 in between the anode thin-film wiring layer 331 and forming a cathode thin-film wiring layer 332 with sandwiching an interlayer insulating film 334 in between the cathode thin-film wiring layer 332 and the LED chip 310.

As shown FIG. 10, FIG. 11 or FIG. 12, the substrate-side structure 320 includes a substrate 321, a raised part (or projecting structure) 322 being disposed on the substrate 321, a plurality of cathode conductive wiring layers 323 being formed on the substrate 321 and supplying a cathode potential as a second electric potential, an interlayer insulating film 324 being formed on the cathode conductive wiring layer 323

(shown in only FIG. 10), and a plurality of anode conductive wiring layers 325 being formed on the substrate 321 and the interlayer insulating film 324 and supplying an anode potential as a first electric potential. The plurality of cathode conductive wiring layers 323 and the plurality of anode conductive wiring layers 325 extend in orthogonal directions to each other and form matrix-shaped conductive wiring layers, for example. The anode conductive wiring layer 325 is insulated from the cathode conductive wiring layer 323 by providing the interlayer insulating film 324 therebetween. Each of the conductive wiring layers can be 1 μm or less in thickness, for example.

As shown FIG. 11 or FIG. 12, the raised part 322 is formed to be higher than both of the anode conductive wiring layer 325 and the cathode conductive wiring layer 323. In other words, the raised part 322 has an upper surface which is higher than upper surfaces of the anode conductive wiring layer 325 and the cathode conductive wiring layer 323. The raised part 322 has the same structure as the raised part 122 in the first embodiment.

As shown FIG. 11 or FIG. 12, LED chip 310 includes a laminated structure of an N-type contact layer 312, an N-type clad layer 313, an active layer 314, a P-type clad layer 315, a P-type contact layer 316 and an anode electrode pad 317, and further includes a cathode electrode pad 311 on the N-type contact layer 312. The LED chip 310 is mounted on the raised part 322 in the same manner as the LED chip 110 in the first embodiment. The raised part 322 makes levels of upper surfaces of the anode electrode pad 317 and the cathode electrode pad 311 of the LED chip 310 (i.e., an upper surface of the anode electrode pad 317 and an upper surface of the cathode electrode pad 311) higher than levels of upper surfaces of the anode conductive wiring layer 325 and the cathode conductive wiring layer 323. The LED chip 310 can be a semiconductor thin film light emitting element, for example. The anode electrode pad 317 is connected to the anode conductive wiring layer 325 by the anode thin-film wiring layer 331, and the cathode electrode pad 311 is connected to the cathode conductive wiring layer 323 by the cathode thin-film wiring layer 332. The anode thin-film wiring layer 331 is a conductive thin film layer extending on from the anode electrode pad 317 to the anode conductive wiring layer 325 along the interlayer insulating film 333. The cathode thin-film wiring layer 332 is a conductive thin film layer extending from the cathode electrode pad 311 to the cathode conductive wiring layer 323 through the interlayer insulating film 334. The structure of the LED chip 310 is an effective structure to adopt an LED which uses a nitride semiconductor, on which a rear surface electrode is difficult to form. The LED structure in the third embodiment is suitable for a case that a thin film LED having a thickness of 5 μm or less is used as an LED chip. In such a case, a thin film LED can be formed and fixed, for example, by placing an etchable layer on a growth substrate as an element-producing substrate, wherein a thin film LED is formed on the etchable layer, forming a thin-film LED element structure including a plurality of thin film LED elements on the etchable layer by epitaxial growth or the like, separating the thin film LED element structure into pieces, selectively etching the etchable layer, thereby removing the individual LED elements from the growth substrate, and placing the LED elements to be adhered to the substrate structure 320 which is shown in the drawings. The anode thin-film wiring layer 331 and the cathode thin-film wiring layer 332 can be formed by a combination of lithography and, deposition or sputtering, for example.

In the image display apparatus 300 according to the third embodiment, even if an arrangement position of the LED chip 310 is slightly shifted in a high precision mounting process of the LED chip 310 on the substrate-side structure 320, no short circuit between the conductive wiring layers occurs because of the shifted LED chip 310.

As described above, the image display apparatus 300 according to the third embodiment can extremely reduce occurrence frequency of a short circuit between the conductive wiring layers because of the LED chip 310 mounted on the substrate-side structure 320 on which the anode conductive wiring layer 325 and the cathode conductive wiring layer 323 are formed, and thereby the highly-reliable image display apparatus 300 with a low failure rate can be provided.

Furthermore, a use of a thin film LED as the LED chip 310 enables to connect by the thin-film wiring layer instead of the bonding wires, and thereby a further high precision mounting can be achieved. Therefore, according to the third embodiment, a further high definition LED display can be realized.

Except for the points described above, the third embodiment is the same as the first or the second embodiment.

Fourth Embodiment

Figure 13:
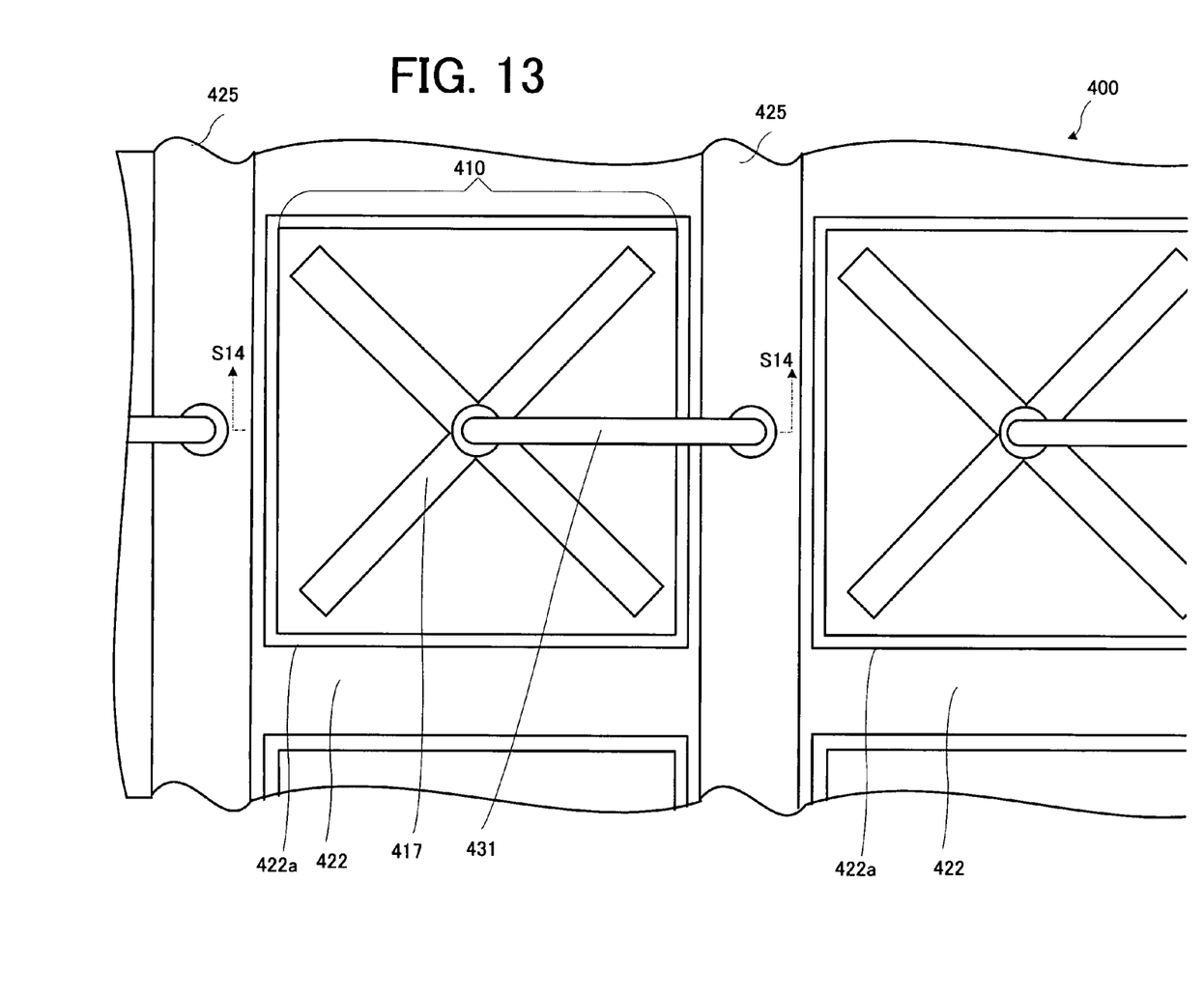
FIG. 13 is a plan view schematically showing a principal part of an image display apparatus fourth embodiment of the present invention.
Figure 14:
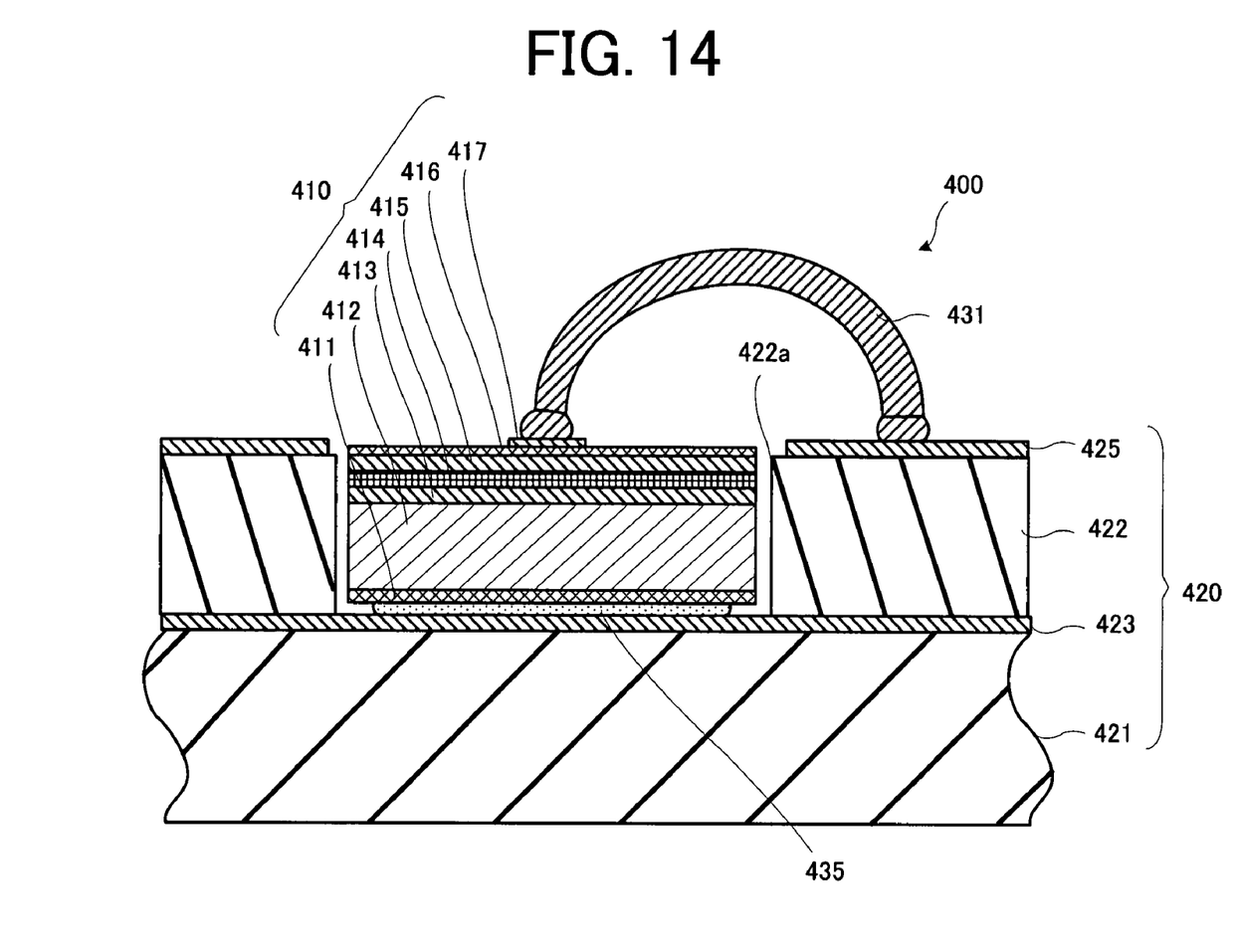
FIG. 14 is a schematic sectional view taken along a line S14-S14 of FIG. 13.

FIG. 13 is a plan view schematically showing a principal part of an image display apparatus 400 according to the fourth embodiment, and FIG. 14 is a schematic sectional view taken along a line S14-S14 of FIG. 13. FIG. 13 and FIG. 14 show only a part of the image display apparatus 400. The image display apparatus 400 is an LED display for displaying an image by selectively emitting light from a plurality of semiconductor light emitting elements (LEDs or LED chips) 410 as pixels, which are regularly arranged, for example, in the form of two-dimensional matrix arrangement. As shown in FIG. 13 and FIG. 14, the image display apparatus 400 is formed by adhering a plurality of LED chips 410 manufactured in advance to a substrate-side structure 420 and then bonding a plurality of bonding wires 431.

As shown in FIG. 13 or FIG. 14, the substrate-side structure 420 includes a substrate 421, a cathode conductive wiring layer 423 being formed on the substrate 421 and supplying a cathode potential as a second electric potential, a raised part (or projecting structure) 422 being disposed on the substrate 421 through the cathode conductive wiring layer 423, and a plurality of anode conductive wiring layers 425 being formed on the raised part 422 and supplying an anode potential as a first electric potential.

As shown in FIG. 14, the raised part 422 is formed to be higher than the cathode conductive wiring layer 423. In other words, the raised part 422 is disposed on the substrate 421, and the raised part 422 has an upper surface which is higher than an upper surface of the cathode conductive wiring layer 423. It is preferable that the height of the raised part 422 be equal to or more than that of the LED chip 410. The raised part 422 has the same structure as the raised part 122 in the first embodiment.

As shown in FIG. 14, the LED chip 410 includes a laminated structure of a cathode electrode pad 411, an N-type contact layer 412, an N-type clad layer 413, an active layer 414, a P-type clad layer 415, a P-type contact layer 416, and an anode electrode pad 417. The LED chip 410 is mounted on the cathode conductive wiring layer 423 in an area without the raised part 422 (i.e., an area inside a hole 422a), in the same manner as the LED chip 110 in the first embodiment. The raised part 422 makes a level of a bonding surface of the LED chip 410 (i.e., an upper surface of the anode electrode pad 417) higher than a level of an upper surface of the cathode conductive wiring layer 423. The LED chip 410 can be a semiconductor thin film light emitting element, which has been described in the third embodiment, for example. The anode electrode pad 417 is connected to the anode conductive wiring layer 425 by the Au bonding wire 431, for example, and the cathode electrode pad 411 is electrically connected to the cathode conductive wiring layer 423 by an adhesive or die-bonding paste 435. The LED chip 410 has the same structure as in the first embodiment.

In the image display apparatus 400 according to the fourth embodiment, even if an arrangement position of the LED chip 410 is slightly shifted in a high precision mounting process of the LED chip 410 on the substrate-side structure 420, no short circuit between the conductive wiring layers occurs because of the shifted LED chip 410.

Further, in the image display apparatus 400 according to the fourth embodiment, in a case that the LED chip 410 is adhered to the substrate-side structure 420 with fluid conductive paste such as die-bonding paste, even if the die-bonding paste is forced out (or overflowed) from under the LED chip 410 at an arrangement position of the LED chip 410, no short circuit between the conductive wiring layers occurs because of the overflowed die-bonding paste.

As described above, the image display apparatus 400 according to the fourth embodiment can extremely reduce occurrence frequency of a short circuit between the conductive wiring layers because of the LED chip 410 mounted on the substrate-side structure 420, on which the anode conductive wiring layer 425 and the cathode conductive wiring layer 423 are formed, and thereby the highly-reliable image display apparatus 400 with a low failure rate can be provided.

Furthermore, the image display apparatus 400 according to the fourth embodiment reduces a difference in height between a bonding position on the LED chip 410 and a bonding position on the anode conductive wiring layer 425, accordingly makes connection of the Au bonding wire 431 easy, and thereby realizes a further high precision mounting.

Moreover, the image display apparatus 400 according to the fourth embodiment includes the raised part 422 whose height exceeds that of the LED chip 410 (the height of the active layer 414, in particular), accordingly achieves an advantageous effect to block radiated light travelling toward a horizontal direction of the LED chip 410, and therefore, directivity of the radiated light can be improved and an LED display which reduces color blur can be manufactured.

Except for the points described above, the fourth embodiment is the same as any one of the first to third embodiments.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. An image display apparatus comprising:
a substrate;
a first conductive wiring layer being formed on the substrate and supplying a first electric potential;
a second conductive wiring layer supplying a second electric potential;
a plurality of semiconductor light emitting elements selectively emitting light and being regularly arranged on the substrate, the plurality of semiconductor light emitting elements each including a first electrode layer being electrically connected to the first conductive wiring layer and a second electrode layer being electrically connected to the second conductive wiring layer;
a plurality of raised parts being disposed on the substrate, each of the raised parts having an upper surface which is higher than an upper surface of the first conductive wiring layer,
wherein each of the plurality of semiconductor light emitting elements is fixed on a respective one of the plurality of raised parts and has a lower surface facing the upper surface of the respective raised part, each lower surface having an area equal to an area of the upper surface of the respective raised part, and
each of the plurality of semiconductor light emitting elements is disposed to have no part extending outside a periphery of the upper surface of the respective raised part; and
a plurality of first thin-film wiring layers being formed on and from the first electrode layers to the first conductive wiring layer along the semiconductor light emitting elements and electrically connecting the first electrode layers and the first conductive wiring layer.

2. The image display apparatus according to claim 1, wherein each of the plurality of semiconductor light emitting elements is a semiconductor thin film light emitting element having a thickness of 5 µm or less.

3. The image display apparatus according to claim 1, wherein each of the plurality of semiconductor light emitting elements is a semiconductor thin film light emitting element which was formed on an element-producing substrate that is different from the substrate.

4. The image display apparatus according to claim 1, wherein each of the plurality of the raised parts is any one of a structural part being integrally formed with the substrate and a structural member being adhered to the substrate.

5. The image display apparatus according to claim 1, wherein each semiconductor light emitting element is fixed to the respective raised part with one of die-bonding paste, an adhesive agent, eutectic bonding and intermolecular force bonding.

6. The image display apparatus according to claim 1, further comprising a plurality of second thin-film wiring layers being formed on and from the second electrode layers to the second conductive wiring layer along the plurality of semiconductor light emitting elements and electrically connecting the second electrode layers and the second conductive wiring layer.

7. An image display apparatus comprising:
a substrate;
a first conductive wiring layer being formed on the substrate and supplying a first electric potential;
a second conductive wiring layer supplying a second electric potential;
a plurality of semiconductor light emitting elements selectively emitting light and being regularly arranged on the substrate, the plurality of semiconductor light emitting elements each including a first electrode layer being electrically connected to the first conductive wiring layer and a second electrode layer being electrically connected to the second conductive wiring layer;
a plurality of raised parts being disposed on the substrate, each of the raised parts having an upper surface which is higher than an upper surface of the first conductive wiring layer,
wherein each of the plurality of semiconductor light emitting elements is fixed on a respective one of the plurality of raised parts and has a lower surface facing the upper surface of the respective raised part, each lower surface having an area equal to an area of the upper surface of the respective raised part, and each of the plurality of semiconductor light emitting elements is disposed to have no part extending outside a periphery of the upper surface of the respective raised part; and a plurality of first bonding wires electrically connecting the first electrode layers and the first conductive wiring layer, wherein the second conductive wiring layer includes a section extending from the substrate to the plurality of raised parts, and each second electrode layer is connected to the second conductive wiring layer on the respective raised part.

8. The image display apparatus according to claim 7, wherein each of the plurality of the raised parts is any one of a structural part being integrally formed with the substrate and a structural member being adhered to the substrate.

9. The image display apparatus according to claim 7, wherein each semiconductor light emitting element is fixed to the respective raised part with one of die-bonding paste, an adhesive agent, eutectic bonding and intermolecular force bonding.

10. An image display apparatus comprising:
a substrate;
a first conductive wiring layer supplying a first electric potential;
a second conductive wiring layer being formed on the substrate and supplying a second electric potential;
a plurality of semiconductor light emitting elements selectively emitting light and being regularly arranged on the substrate, each of the plurality of semiconductor light emitting elements including a first electrode layer being electrically connected to the first conductive wiring layer and a second electrode layer being electrically connected to the second conductive wiring layer; and
a plurality of raised parts being disposed on the substrate, the raised parts each having an upper surface which is higher than an upper surface of the second conductive wiring layer,
a part of the first conductive wiring layer being disposed on the raised parts, and the plurality of semiconductor light emitting elements are fixed to the second conductive wiring layer,
the second electrode layer of one of the plurality of semiconductor light emitting elements having a lower surface facing the upper surface of the second conductive wiring layer in an area surrounded by the plurality of raised parts, the lower surface having an area that is substantially the same as an area of the second conductive wiring layer that is disposed between the plurality of raised parts, and the first electrode layer of each of the plurality of semiconductor light emitting elements and the first conductive wiring layer being electrically connected above the plurality of raised parts.

11. The image display apparatus according to claim 10, wherein each of the plurality of semiconductor light emitting elements is a semiconductor thin film light emitting element having a thickness of 5 μm or less.

12. The image display apparatus according to claim 10, wherein each of the plurality of semiconductor light emitting elements is a semiconductor thin film light emitting element which was formed on an element-producing substrate that is different from the substrate.

13. The image display apparatus according to claim 10, wherein each of the plurality of raised parts is any one of a structural part being integrally formed with the substrate and a structural member being adhered to the substrate.

14. The image display apparatus according to of claim 10, wherein each of the plurality of semiconductor light emitting elements is fixed to the second conductive wiring layer with any one of die-bonding paste, an adhesive agent, eutectic bonding and intermolecular force.

15. The image display apparatus according to claim 10, further comprising a plurality of first bonding wires connecting the first electrode layers and the first conductive wiring layers.

16. The image display apparatus according to claim 15, further wherein the first bonding wires are disposed entirely above the raised part.

17. The image display apparatus according to claim 10, wherein the one semiconductor light emitting element is disposed entirely above the second conductive wiring layer.

18. The image display apparatus according to claim 10, wherein the one semiconductor light emitting element has a plurality of layers each being equal in area to the area of the lower surface.

19. The image display apparatus according to claim 10, wherein the one semiconductor light emitting element has a substantially uniform area throughout an entire height of the one semiconductor light emitting element.

* * * * *